United States Patent [19]

Bruestle

[11] Patent Number: 4,618,849
[45] Date of Patent: Oct. 21, 1986

[54] GRAY CODE COUNTER

[75] Inventor: John H. Bruestle, North Plainfield Borough, N.J.

[73] Assignee: RCA Corporation, Princeton, N.J.

[21] Appl. No.: 666,721

[22] Filed: Oct. 31, 1984

[51] Int. Cl.⁴ ............................................. H03M 1/00
[52] U.S. Cl. .............................. 340/347 DD; 377/44
[58] Field of Search .................. 340/347 DD; 377/44

[56] References Cited

U.S. PATENT DOCUMENTS

| | | | |
|---|---|---|---|
| 2,982,953 | 5/1961 | Cadden et al. | 340/347 DD |
| 3,138,794 | 6/1964 | Blum | 340/347 DD |
| 3,210,756 | 10/1965 | Flood | 340/347 DD |
| 3,393,298 | 7/1968 | Olson | 377/44 |
| 3,588,461 | 6/1971 | Halsall | 340/347 DD |

Primary Examiner—Bernard Roskoski
Attorney, Agent, or Firm—Joseph S. Tripoli; Henry I. Schanzer

[57] ABSTRACT

A gray code counter is produced from a binary code counter by connecting each output of the binary counter to a "toggle" flip-flop. Each toggle flip-flop has a toggle input connected to its corresponding binary output. The output of each toggle flip-flop changes state (i.e. "toggles") only when its corresponding binary code bit makes a transition from a first level to a second level (i.e., it does not change state when its corresponding binary code bit makes a transition from the second level to the first level).

6 Claims, 5 Drawing Figures

GRAY CODE COUNTER

This invention relates to digital information processing systems and, in particular, to a counting system for concurrently producing a "natural" binary code, hereafter referred to as "binary" code, and its corresponding "Gray" binary code, hereafter referred to as "gray" code.

Conventional binary counters are widely used and are highly suitable for arithmetic operations. However, in known conventional binary counters, more than one stage can change state for each count.

By way of example, in a conventional serial binary counter, pulses to be counted are applied to the lowest order binary stage. Each time the lowest stage changes state, an indication is sent to the next higher order stage. This higher order stage when it changes state also sends or causes the propagation of an indication to the next higher order stage. This process is repeated from stage to stage along the counter. Due to the nature of the binary count, more than one stage can change state in response to the same input pulse. Furthermore, due to the serial propagation of the changes along the counter chain, different stages change at different times in response to the same input pulse. Consequently, if the counter contents are read, or sensed, while a count is being propagated, different valued outputs will be obtained, and, since more than one stage can change state, a multi-count error is possible.

The problem of sensing a multi-count error is avoided by use of a "gray" binary code. As is well known, in a gray code counter only one stage changes state for each count. Therefore, no more than a single count error can occur in a gray code counter while a pulse is being propagated and the counter is being read. It is therefore desirable to be able to have a counter with a gray code output.

Circuits embodying the invention include a conventional binary counter having "N" binary outputs (where "N" is an integer greater than 1) for producing a conventional binary coded count at the "N" binary outputs, and one "toggle" flip-flop per binary output. Each toggle flip-flop has a toggle input connected to its corresponding binary output and has an output which changes state (i.e. "toggles") only in response to transitions at its toggle input of one polarity. That is, its output remains unchanged in response to transitions at its toggle input of a polarity opposite to the one polarity.

Consequently, in circuits embodying the invention, corresponding to each bit of a binary code there is produced a corresponding gray code bit. Conversion from a binary code to a corresponding gray code is simply and efficiently achieved by causing a change of state in the gray code bit when its corresponding binary code bit makes a transition from a first level to a second level and allowing no change in the gray code bit when its corresponding binary code bit makes a transition from the second level to the first level.

In the accompanying drawing like reference characters denote like components; and FIG. 1 is a block diagram of a counting system embodying the invention;

In the discussion to follow, description of the operation will be in boolean terms with a "high" or logic "1" condition defining one binary state and a logic "low" or logic "0" condition defining the other binary state.

Figure 1:
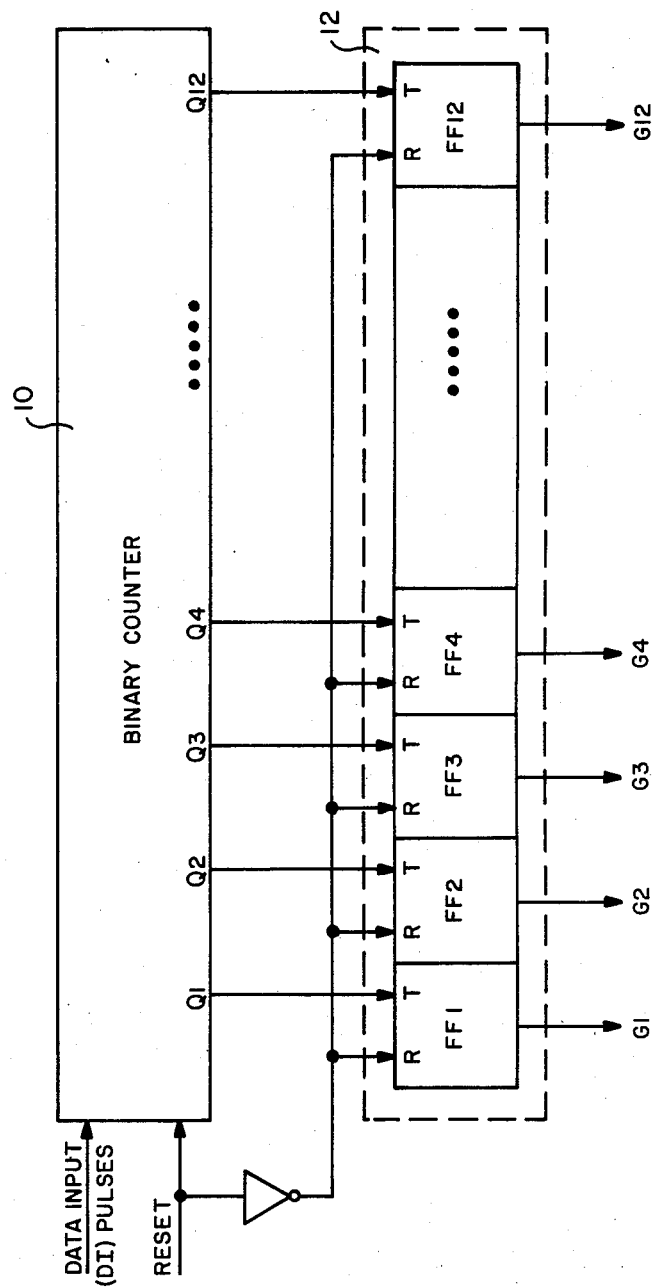

The circuit of FIG. 1 includes a binary counter 10 which, by way of example, may be a COS/MOS ripple-carry binary counter of the type known as the CD4040 manufactured by RCA Corp. The CD4040 is a 12 stage ripple counter described at pages 107–110 of the RCA COS/MOS Integrated Circuits Data Book, printed in 1978. The information contained in the data sheets is incorporated herein by reference.

The structure and operation of ripple-carry binary counters is well known in the art and need not be greatly detailed. Suffice it to say that the counter stages of binary counter 10 are master-slave flip-flops. The output of each stage of counter 10 changes state on a negative (high-to-low) transition of the signal at its input. The stages of counter 10 do not change state on a low-to-high transition at their input. A high level on the reset line (R) of counter 10 resets the counter stage outputs to their zero state (i.e. $Q1=Q2=Q3=$ logic "0" or "low"). For ease of illustration, only five outputs ($Q1, Q2, Q3, Q4$ and $Q12$) of counter 10 are identified in FIG. 1.

Figure 2A:
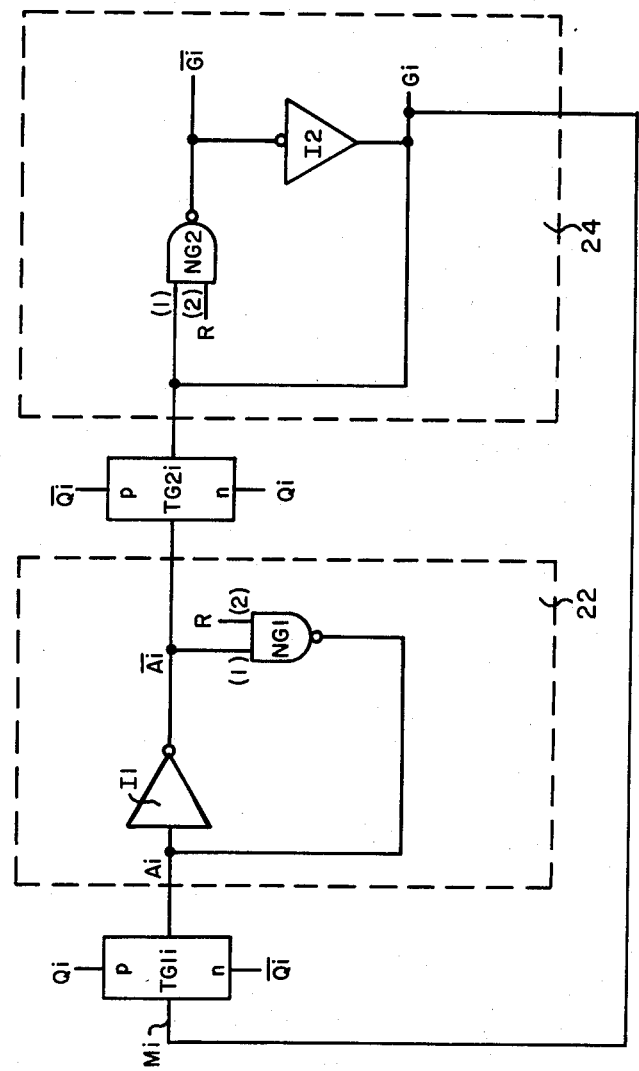
FIG. 2 is a schematic diagram of a data (D)-type flip-flop useful in the circuit of FIG. 1.
FIG. 2B is a waveform diagram illustrating the operation of the flip-flop of FIG. 2A.

Connected to each output (Qi) of binary counter 10 is the toggle input (T) of a data ("D") type flip-flop (FFi) connected to function as a "toggle" flip-flop as shown in FIG. 2A. The output (Gi) of each D-type flip-flop, interconnected to function as a "toggle" flip-flop (FFi), is designed to change state (go from 0-to-1 or from 1-to-0) whenever its toggle input (Qi) makes a transition from a low level-to-a high level. On a high-to-low transition, the output (Gi) of the toggle flip-flop (FFi) does not change state.

The combination of the toggle flip-flops (FFi) connected to the outputs (Qi) of the binary counter 10 define a gray code counter 12.

The "toggle" flip-flops (FFi) may be any one of a number of known flip-flops interconnected such that their outputs change state (i.e. go from high-to-low, or low-to-high) for one transition of the toggle input (e.g. low-to-high transition) but which do not change state for the other transiton (e.g. high-to-low) of their toggle input. The toggle flip-flop shown in FIG. 2A is a master-slave flip-flop comprised of master section 22 and slave section 24. Each toggle flip-flop may also include an additional inverter I3 to produce the complement of the Qi input. Each one of sections 22 and 24 includes an inverter (I1, or I2) and a 2-input NAND gate (NG1, or NG2). The logic level present at the data input (Mi) is transferred into the master section 22 when transmission gate TG1i is enabled. TG1i is enabled (acts as a low impedance) when Qi is low and $\overline{Qi}$ is high. The logic level $\overline{Ai}$ present at the output of section 22 is transferred to the slave section 24 when transmission gate TG2i is enabled. TG2i is enabled when Qi is high and $\overline{Qi}$ is low. The output Gi of section 24 is fed back to the Mi input of the flip-flop for producing the toggling action of the flip-flop.

The operation of the toggle flip-flop is well known and need not be greatly detailed. However, to better understand the discussion of the invention to follow, a brief description of the operation of the circuit of FIG. 2A follows.

Figure 2A:
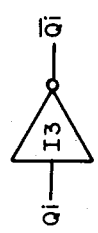
Figure 2B:
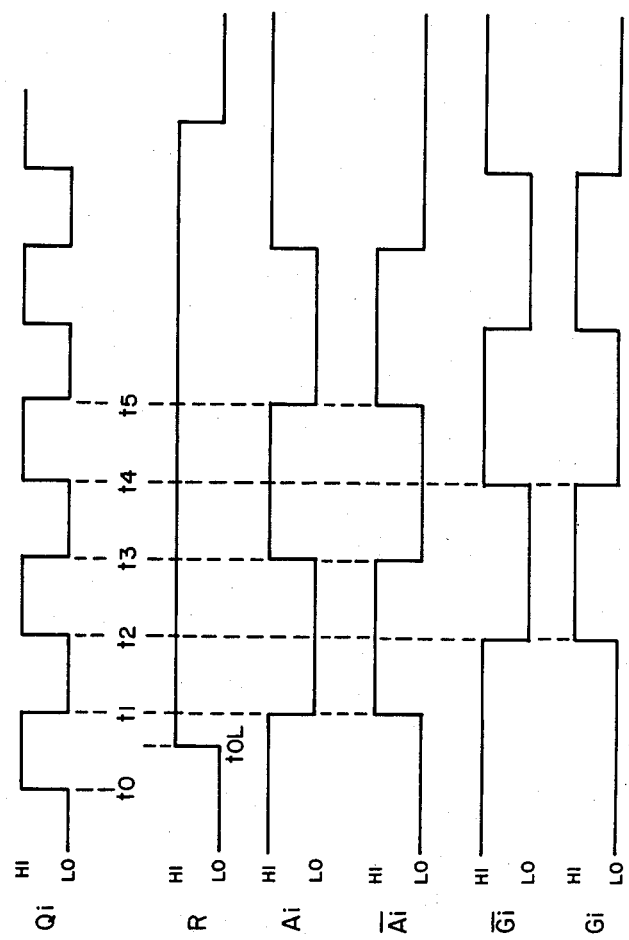

Assume that initially the R (reset) input to the flip-flop of FIG. 2A is "low" as shown for time $t_o$ to $t_{OL}$ in FIG. 2B. R-"low" causes Ai and $\overline{Gi}$ to go high which in turn causes $\overline{Ai}$ and Gi to go low. Assume also that so long as R remains low the above condition is maintained. After R goes high as shown at time $t_{OL}$ in FIG. 2B, the operation of the flip-flop may be described as follows.

So long as Qi is high (and $\overline{Qi}$ is low)—from $t_{OL}$ to t1—TG2i remains enabled (i.e. ON) and TG1i remains disabled (i.e. OFF). Ai-which is low is then applied to one input (1) of NG2 whose other input (R) is now high. $\overline{Ai}$ low ensures that $\overline{Gi}$ remains high and Gi remains low.

When Qi goes from high-to-low, as shown for time $t_1$ in FIG. 2B, TG1i is enabled and TG2i is disabled. The enabling of TG1i causes the "low" at Gi to be applied to the input of stage 22 causing Ai to go low and $\overline{Ai}$ to go high, as shown for time $t_1$ to $t_2$ in FIG. 2B. Since TG2i is disabled $\overline{Gi}$ and Gi remain high and low respectively. When Qi goes from low-to-high, as shown for time $t_2$ in FIG. 2B, TG2i is turned-on and the low Ai output of stage 22 is applied to the input of stage 24 causing $\overline{Gi}$ to go low and Gi to go high. When Qi goes high, TG1i is disabled whereby Ai and $\overline{Ai}$ remain low and high, respectively, as shown for time $t_1$ to $t_3$ in FIG. 2B.

On the high-to-low transition of Qi, as shown for time $t_3$ in FIG. 2B, TG1i is again turned on and TG2i is again turned-off. The turn-on of TG1i causes G1 which is high to be applied to the input of inverter I1 causing Ai to go high and $\overline{Ai}$ to go low as shown at time t in FIG. 2B. Since TG2i is OFF, Gi and $\overline{Gi}$ remain low and high respectively, as shown for time t3 to t4 in FIG. 2B.

Therefore, in general, whenever Qi makes a transition from low-to-high the outputs Gi and $\overline{Gi}$ change state while the outputs Ai and $\overline{Ai}$ remain unchanged. Whenever Qi makes a transition from high-to-low, the outputs $\overline{Gi}$ and Gi remain unchanged while the outputs Ai and $\overline{Ai}$ change state. This operation of a toggle flip-flop is well known and further detail is deemed unnecessary.

Referring back to the circuit of FIG. 1 its operation will now be explained with reference to the waveform diagrams of FIG. 3 and to Tables 1A and 1B below; where Table 1A presents the binary code for numbers 0 to 16 while Table 1B presents the corresponding gray code.

As detailed below the invention resides in part in the recognition that each time a bit (Qi) of the binary code makes a transition from 0-to-1 the corresponding bit of the gray code (Gi) changes state (i.e. it goes from 0-to-1 or from 1-to-0). However, when a bit (Qi) of the binary code makes a transition from 1-to-0 or remains in its previous state the corresponding gray code bit (Gi) remains unchanged, as may be noted from observation of changes in Table 1A and corresponding changes in Table 1B.

TABLE 1A

| | BINARY CODE | | | | |
|---|---|---|---|---|---|
| | Q5 | Q4 | Q3 | Q2 | Q1 |
| 0 | 0 | 0 | 0 | 0 | 0 |
| 1 | 0 | 0 | 0 | 0 | 1 |
| 2 | 0 | 0 | 0 | 1 | 0 |
| 3 | 0 | 0 | 0 | 1 | 1 |
| 4 | 0 | 0 | 1 | 0 | 0 |
| 5 | 0 | 0 | 1 | 0 | 1 |
| 6 | 0 | 0 | 1 | 1 | 0 |
| 7 | 0 | 0 | 1 | 1 | 1 |
| 8 | 0 | 1 | 0 | 0 | 0 |
| 9 | 0 | 1 | 0 | 0 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 16 | 1 | 0 | 0 | 0 | 0 |

TABLE 1B

| | GRAY CODE | | | | |
|---|---|---|---|---|---|
| | G5 | G4 | G3 | G2 | G1 |
| 0 | 0 | 0 | 0 | 0 | 0 |
| 1 | 0 | 0 | 0 | 0 | 1 |
| 2 | 0 | 0 | 0 | 1 | 1 |
| 3 | 0 | 0 | 0 | 1 | 0 |
| 4 | 0 | 0 | 1 | 1 | 0 |
| 5 | 0 | 0 | 1 | 1 | 1 |
| 6 | 0 | 0 | 1 | 0 | 1 |
| 7 | 0 | 0 | 1 | 0 | 0 |
| 8 | 0 | 1 | 1 | 0 | 0 |
| 9 | 0 | 1 | 1 | 0 | 1 |
| 10 | 0 | 1 | 1 | 1 | 1 |
| 11 | 0 | 1 | 1 | 1 | 0 |
| 12 | 0 | 1 | 0 | 1 | 0 |
| 13 | 0 | 1 | 0 | 1 | 1 |
| 14 | 0 | 1 | 0 | 0 | 1 |
| 15 | 0 | 1 | 0 | 0 | 0 |
| 16 | 1 | 1 | 0 | 0 | 0 |

By way of example, note that the gray code bit G1 which corresponds to binary code bit Q1 changes state only when Q1 makes a transition from 0-to-1. When Q1 makes a transition from 1-to-0, the corresponding G1 bit remains in its previous state. This is also true for G2 which corresponds to Q2, G3 which corresponds to Q3, and in general for any Gi which corresponds to Qi.

By way of a further example, note that the number 7 is expressed in binary code as 00111 and in gray code as 00100. Upon receipt of an additional data input the binary code 00111 corresponding to number 7 goes to binary code 01000 corresponding to number 8.

Referring to Table 1A note that in going from 7 to 8:
(a) Q1 has gone from 1 to 0
(b) Q2 has gone from 1 to 0
(c) Q3 has gone from 1 to 0
(d) Q4 has gone from 0 to 1
(e) Q5 has remained at 0.

Referring to Table 1B note that:
(a) The G1, G2 and G3 bits corresponding to Q1, Q2 and Q3, respectively, which changed from 1 to 0 remain unchanged at "0".
(b) The G4 bit corresponding to the Q4 bit which changed from 0 to 1 changed state from 0 to 1.
(c) The G5 bit corresponding to Q5 which remained at 0 remains unchanged.

The circuit of the invention as described below ensures the logical implementation of the above recognized conditions.

In the discussion of the operation of FIG. 1 to follow, assume that initially all binary outputs (Qi) of the binary counter 10 are reset to zero and that likewise all the outputs G1 through G12 of the toggle flip-flops are also reset to zero.

Figure 3:
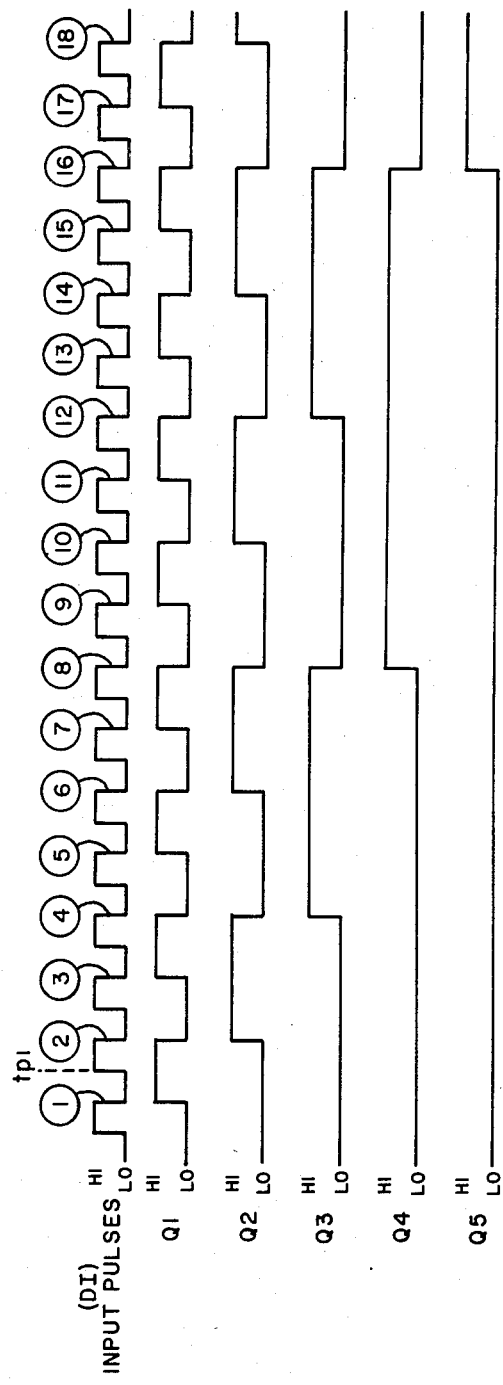
FIG. 3 is a diagram of waveforms at various nodes of the circuit of FIG. 1.

On the first negative transition (i.e. the first count) of the data input pulse (DI), the Q1 output of binary counter 10 goes from low-to-high as shown at 1 in FIG. 3. All the other Qi outputs of binary counter 10 remain in their zero state. The first five stages of binary counter 10 assume the output conditions corresponding to decimal number 1 in Table 1A.

When Q1 goes from low-to-high, its associated toggle flip-flop FF#1, is toggled such that its output G1 goes from 0 to 1. The remaining outputs Gi of the other toggle flip-flops of counter 12 remain reset at 0. Therefore, the outputs of the toggle flip-flops define the conditions corresponding to decimal number 1 in Table 1B.

On the positive going transition of the input pulse (e.g. at time $T_{P1}$ in FIG. 3), and on all succeeding positive going transitions of the input pulse, the Qi outputs of binary counter 10 remain in their previously set state. Thus, no change in the Qi outputs occurs until the data input pulse (DI) makes a transition from high-to-low.

On the second 2 negative going transition (i.e. the second count) of the input pulse, Q1 is driven from high-to-low and Q2 is driven from low-to-high as shown at 2 FIG. 3. The output of binary counter 10 then assumes the condition corresponding to number 2 in Table 1A. As explained above, the high-to-low transition of Q1 has no effect on FF#1 and G1 remains high. However, the low-to-high transition of Q2 causes FF#2 to toggle and G2 to go from low-to-high. The output of the gray counter then assumes the condition corresponding to number 2 shown in Table 1B.

On the third 3 data input pulse, Q1 goes from 0-to-1, and Q2 remains high as shown at 3 in FIG. 3. The remaining Qi outputs remain at 0. The state of the binary counter then corresponds to the conditions of number 3 in Table 1A. As set forth above, the 0-to-1 transition of Q1 causes FF#1 to toggle whereby G1 which was high is switched to the low or "0" condition. Concurrently since Q2 remains high G2 remains high and the remaining Gi outputs remain set to 0. The gray code counter output then corresponds to the state of number 3 in Table 1B.

On the fourth 4 data input pulse, Q1 and Q2 are switched from 1-to-0 and Q3 is switched from 0-to-1. The output of the binary counter then corresponds to the condition of number 4 in Table 1A. The 1-to-0 transitions of the Qi outputs do not affect the Gi outputs of the gray code counter. Hence G1 and G2 remain in their previous state of 0 and 1, respectively. However, the 0-to-1 transition of Q3 causes FF#3 to toggle and G3 to go from 0-to-1. The outputs of the gray code counter then assume the condition corresponding to number 4 in Table 1B.

The response of the binary counter to succeeding input pulses is well known and will not be further detailed. It is sufficient to say that the outputs of the binary counter will assume the corresponding condition shown in Table 1A.

Corresponding to the changes produced at the output of the binary counter, the toggle flip-flops cause the gray code count to change and produce corresponding outputs as illustrated in Table 1 B. It is therefore evident that by the simple expedient of connecting a toggle flip-flop to each output of a binary counter, a binary counter may be converted to a gray code count and both the binary count and the gray code count are available to a user.

In the circuit of FIG. 1, the binary output Q12 of counter 10 is shown connected to toggle flip-flop ff12. However, it should be noted that, where Q12 is, in fact, the last output of the binary counter, Q12 could be directly connected to the G12 line and would be used as, and could function as, the G12 output. The last toggle flip-flop (i.e. ff12) would not then be needed and could be eliminated.

Alternatively, where any binary output (e.g. Q12) is, in fact, the last output of the binary counter and that binary output (e.g. Q12) is connected to a toggle flip-flop (e.g. ff12) whose output (e.g. G12) is fed to some utilization device (not shown) and where the binary counter can overflow (i.e. the last output, e.g. Q12, can be driven or reset from the logic "1" to the logic "0" condition), means (not shown) must be provided to reset the gray code counter to its initial condition, whenever the binary counter 10 overflows, to ensure maintaining the correct counting sequence of the gray code counter output.

It should be appreciated that the invention resides in part in the recognition that by responding solely to the 0-to-1 transitions of the binary output and ignoring the 1-to-0 transitions, a binary to gray code conversion has been effectuated simply and efficiently.

The invention has been illustrated using a ripple or serial binary counter and converting its outputs. However, it should be appreciated that a parallel or synchronous type binary counter may be used as a binary counter and its outputs converted to a gray code.

Figure 4:
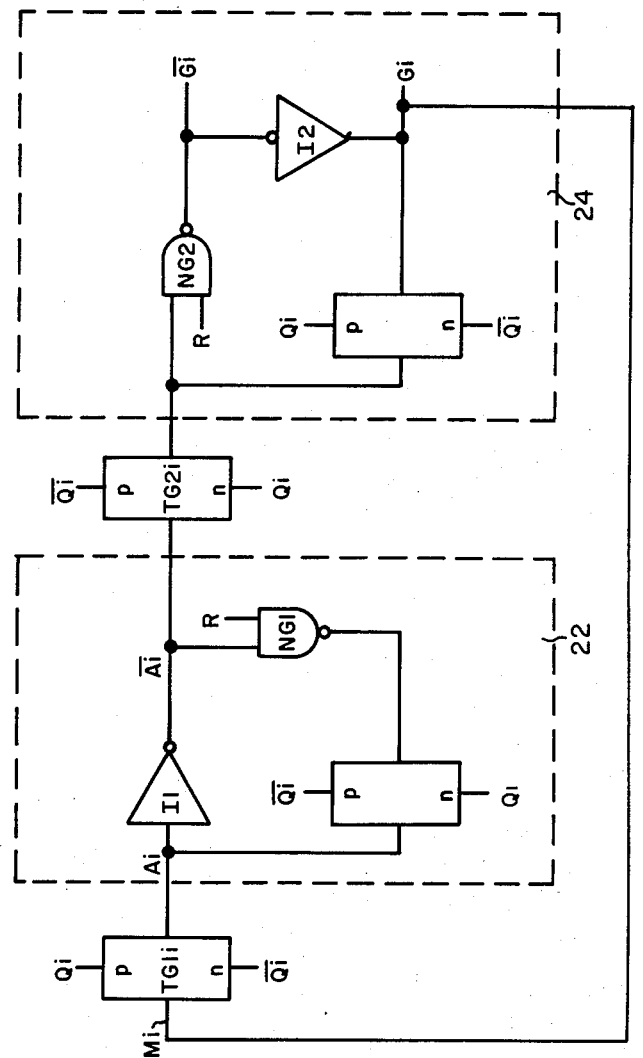
FIG. 4 is a schematic diagram of another toggle flip-flop which may be used in conjunction with the circuit of FIG. 1.
Figure 4:

As noted above, many types of toggle flip-flops may be used to practice the invention. For example, the circuit of FIG. 2A may be modified as shown in FIG. 4 to make the setting and resetting of the flip-flops easier.

In the circuit of FIG. 1, an inverter is connected between the reset line to binary counter 10 and the "R" inputs of flip-flops ff1 through ff12. It should be appreciated that an independent reset control may be used for the flip-flops or the inverter may be eliminated by resetting the flip-flops differently.

What is claimed is:

1. The combination comprising:
    an N stage binary counter having N outputs for producing a binary code at said N outputs; where N is an integer greater than one (1); and
    N toggle flip-flop, each toggle flip-flop having a toggle input and an output, each one of said N toggle flip-flops being connected at its toggle input to a different one of the N binary outputs of said N stage binary counter for causing each one of said N toggle flip-flops to be responsive solely to the binary signal produced at the output of its corresponding binary counter stage, each toggle flip-flop being responsive to the signal at its toggle input and changing state only when, said each time, the signal at its toggle input undergoes a transition from a first level to a second level and remaining in its previous state when the signal at its toggle input makes a transition in the opposite direction.

2. The combination as claimed in claim 1 wherein said N stage binary counter is a ripple down counter.

3. The combination comprising:
    an N stage binary counter having N outputs for producing a binary code at said N outputs; where N is an integer greater than one (1); and
    means for converting the binary coded output of said N stage binary counter to a gray code comprising:
    N toggle flip-flops, one flip-flop per output of said binary counter, each flip-flop having a toggle input and an output, each one of said N toggle flip-flops being directly connected at its input to a different one of the N binary outputs of said N stage binary counter, each one of said N toggle flip-flops being solely responsive to the signal transitions at the output of its corresponding binary counter output and each toggle flip-flop changing state only when, and each time, the signal at its corresponding binary counter output makes a transition from a first level to a second level and remaining in its previous state when the signal at its corresponding binary counter output makes a transition in the opposite direction.

4. A binary code to gray code converter comprising:
N input lines adapted to receive binary coded signals;
N output lines for producing thereon gray code signals corresponding to the binary coded signals on said N input lines; and
N toggle flip-flops, each flip-flop having a toggle input and an output, each one of said N toggle flip-flops being directly and solely connected at its input to a different one of said N input lines and at its output to a different one of said N output lines, each one of said N toggle flip-flops being responsive to the polarity of the signal transition at its input and each one of said toggle flip-flops changing state only when, and each time, the signal at its input makes a transition from a first level to a second level and remaining in its previous state when the signal at its input makes a transition in the opposite direction, whereby the binary coded information on said N input lines is converted into a gray code at the output of said N toggle flip-flops.

5. The combination as claimed in claim 2 wherein each one of said N toggle flip-flops includes a master flip-flop and a slave flip-flop, each one of said master and slave flip-flops having an input and an output, each one of said toggle flip-flops further including a first transmission gate connected between the output of the master flip-flop and the input of the slave flip-flop and a second transmission gate connected between the output of the slave flip-flop and the input to the master flip-flop; and wherein said toggle input of each toggle flip-flop is connected to its said first and second transmission gates for enabling one of said first and second transmission gates and disabling the other one of said first and second transmission gates for one binary value of input signal and for disabling said one of said first and second transmission gates and enabling the other one of said first and second transmission gates for the binary value of input signal.

6. A binary to gray code converter comprising:
an N stage binary counter having N outputs for producing a binary code at said N outputs; where N is an integer greater than one (1);
N toggle flip-flops, one toggle flip-flop per stage of said N binary counter, each toggle flip-flop having a toggle input and an output, each one of said N toggle flip-flops being responsive to the signal at its toggle input and each one of said toggle flip-flops changing state only when, and each time, the signal at its toggle input makes a transition from a first level to a second level and remaining in its previous state when the signal at its toggle input makes a transition in the opposite direction; and
means direct current connecting the toggle input of each one of said N toggle flip-flops to the output of its corresponding binary counter stage for causing each toggle flip-flop to be responsive solely to the binary signals produced at the output of its corresponding binary counter stage.

* * * * *

UNITED STATES PATENT AND TRADEMARK OFFICE
CERTIFICATE OF CORRECTION

PATENT NO. : 4,618,849

DATED : Oct. 21, 1986

INVENTOR(S) : John H. Bruestle

It is certified that error appears in the above-identified patent and that said Letters Patent is hereby corrected as shown below:

Col. 1, line 65, change "FIG. 2" to - - - FIG. 2A - - -.

Col. 2, line 49, change "transiton" to - - - transition - - -.

Col. 3, line 33, after the word time, change "t" to - - - $t_3$ - - -.

Col. 3, line 40, change "Gi" (second occurrence) to - - - $\overline{Gi}$ - - -.

Col. 5, line 3, change "1" to - - - ① - - -.

Col. 5, line 20, change "2" to - - - ② - - -.

Col. 5, line 23, change "2" to - - - ② - - -.

Col. 5, line 31, change "3" to - - - ③ - - -.

Col. 5, line 32, change "3" to - - - ③ - - -.

Col. 5, line 42, change "4" to - - - ④ - - -.

Col. 6, line 53, change "said" to - - - and - - -.

Signed and Sealed this

Sixth Day of January, 1987

Attest:

DONALD J. QUIGG

Attesting Officer

Commissioner of Patents and Trademarks